United States Patent
Kuzuno et al.

(10) Patent No.: US 7,123,527 B2
(45) Date of Patent: Oct. 17, 2006

(54) REDUNDANCY FUSE CIRCUIT

(75) Inventors: Naokazu Kuzuno, Kawasaki (JP);
Kiyoharu Oikawa, Kawasaki (JP);
Kimio Maruyama, Yokohama (JP);
Yasuhiro Watanabe, Yokohama (JP);
Masaya Kubota, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/803,936

(22) Filed: Mar. 19, 2004

(65) Prior Publication Data
US 2004/0240249 A1     Dec. 2, 2004

(30) Foreign Application Priority Data
Mar. 20, 2003  (JP) .............................. 2003-078474

(51) Int. Cl.
*G11C 7/00* (2006.01)
(52) U.S. Cl. ..................... 365/200; 365/225.7; 365/201
(58) Field of Classification Search ................ 365/201, 365/225.7, 189.07, 189.05, 200
See application file for complete search history.

(56) References Cited

U.S. PATENT DOCUMENTS

| | | | | |
|---|---|---|---|---|
| 6,034,903 A | * | 3/2000 | Ichikawa | 365/200 |
| 6,111,798 A | * | 8/2000 | Lee | 365/200 |
| 6,205,050 B1 | * | 3/2001 | Tamaki | 365/154 |
| 6,400,620 B1 | * | 6/2002 | Yoo | 365/200 |
| 6,741,499 B1 | * | 5/2004 | Imamiya et al. | 365/185.17 |
| 6,845,043 B1 | * | 1/2005 | Dono | 365/185.22 |
| 2004/0240249 A1 | | 12/2004 | Kuzuno et al. | |

FOREIGN PATENT DOCUMENTS

| | | |
|---|---|---|
| JP | 4-238199 | 8/1992 |
| JP | 2001-307497 | 11/2001 |

OTHER PUBLICATIONS

U.S. Appl. No. 11/130,141, filed May 17, 2005, Takeda, et al.

\* cited by examiner

*Primary Examiner*—Thong Q. Le
(74) *Attorney, Agent, or Firm*—Oblon, Spivak, McClelland, Maier & Neustadt, P.C.

(57) ABSTRACT

A redundancy fuse circuit including a function of replacing a defective cell in a memory cell array with a redundancy cell, comprising a fuse circuit in which an address of the defective cell or a block including the defective cell is programmed as a defective address by presence/absence of cut-off of a fuse, a data latch circuit which latches a signal supplied from a tester to program the defective address in a dummy manner, and a comparator which replaces the defective cell with the redundancy cell based on an address signal supplied from the tester and an output signal of the data latch circuit at an operation confirmation time of the redundancy fuse circuit.

18 Claims, 4 Drawing Sheets

REDUNDANCY FUSE CIRCUIT

CROSS-REFERENCE TO RELATED APPLICATIONS

This application is based upon and claims the benefit of priority from prior Japanese Patent Application No. 2003-78474, filed Mar. 20, 2003, the entire contents of which are incorporated herein by reference.

BACKGROUND OF THE INVENTION

1. Field of the Invention

The present invention relates to a redundancy fuse circuit in which a defective address is programmed, particularly to a semiconductor integrated circuit including memories such as a semiconductor memory and a memory embedded microcomputer.

2. Description of the Related Art

In a semiconductor integrated circuit including memories such as a semiconductor memory and a memory embedded microcomputer, a defect is generated in a part of a memory cell at a manufacturing time by miniaturization of the memory cell, and the memory cell sometimes becomes defective. In this case, a method is used in which a redundancy fuse circuit is circuit, the defective cell is replaced with a redundancy cell, and a chip is remedied.

FIG. 1 shows an example of a memory circuit including a conventional redundancy fuse circuit.

A memory cell array 10A comprises a plurality of memory cells arranged in an array. Any type of memory cell may be used. A redundancy cell array 10B is disposed adjacent to the memory cell array 10A. The redundancy cell array 10B comprises a plurality of redundancy cells arranged in the array. The redundancy cells replace the defective cells in a case where the defective cells exist in the memory cell array 10A.

A plurality of, for example, 512 word lines are arranged in the memory cell array 10A. These word lines are blocked, for example, every eight lines, and the defective cells are replaced with the redundancy cells by a block unit.

For example, as a result of a test of the memory cell array 10A, if the defective cells are present in positions (A) and (B) in the memory cell array 10A, the defective cells are replaced with the redundancy cells by a unit of eight rows (eight word lines) in the block including the defective cells.

An address signal is input into an address decoder 12 via an address buffer 11. The address decoder 12 decodes the address signal to output a main row address signal MRA, a sub-row address signal SRA, and a column address signal CA.

The main row address signal MRA is input into a main body cell decoder 16 of a sub-row decoder 14 via a main body cell (M/C) decoder 15 of a main row decoder 13. The sub-row address signal SRA is input into the main body cell decoder 16 and a redundancy (R/D) decoder 19 of the sub-row decoder 14 via a common decoder 17 in the sub-row decoder 14. The column address signal CA is input into a column decoder 20.

For example, read data is output as output data BIT0, BIT1, . . . , BITm-1 to the outside of the chip via a column select switch 21, sense amplifies (S/A) 22, and buffers 23.

Defective addresses are programmed in fuse circuits F0, F1, . . . . Concretely, the address (n bits in the present example) of the block including the defective cells is programmed in the fuse circuits F0, F1, . . . . For example, the number of fuse circuits F0, F1, . . . is equal to that of blocks constituting a redundancy array in a memory cell array 10.

The fuse circuits F0, F1, . . . may be of a type in which the defective address is stored by presence/absence of cut-off of a fuse by laser, or an electric fuse (E-fuse) capable of electrically cutting off the fuse may also be used. The fuse circuits F0, F1, . . . are connected to an OR circuit OR1 via selectors SEL0, SEL1, . . . .

When the defective cells are present in the memory cell array 10A, the selectors SEL0, SEL1, . . . select one fuse circuit Fi based on fuse block select signals BLK0, BLK1, . . . . A selector SELi for the selected fuse circuit Fi outputs the defective address programmed in the fuse circuit Fi. The selectors for all the non-selected remaining fuse circuits set all output data of n bits to "0".

Therefore, the defective address programmed in the selected fuse circuit Fi is input into a comparator 24 via the selector SELi and OR circuit OR1. For example, when the fuse block select signal BLK0 is "H", and the other fuse block select signals BLK1, . . . are "L", the defective address of n bits programmed in a fuse circuit F0 is input into the comparator 24 via the selector SEL0 and OR circuit OR1.

The comparator 24 compares n-bits external address data with defective address data of n bits output from the OR circuit OR1. When both the data disagree, for example, a flag FLAG is set to "L". At this time, the address decoder 12 is activated to execute a usual decode operation. When the data agree with each other, for example, the comparator 24 sets the flag FLAG to "H". At this time, the address decoder 12 is inactivated, and redundancy decoders 18, 19 of the main/sub-row decoders 13, 14 are activated.

The conventional redundancy fuse circuits have the following problems.

① Even when the defective cells are replaced with the redundancy cells after a test step, the chip cannot be remedied for a reason that the redundancy cells have defects. In this case, a step of cutting off the fuse is useless, and this causes an increase of manufacturing cost.

② An address different from the address in which the defective cell is present is sometimes programmed by mistake. Even in this case, the chip cannot be remedied, the step of cutting off the fuse is useless, and this causes the increase of manufacturing cost.

③ When the chip cannot be remedied even after the step of cutting off the fuse as described in ① and ②, this cannot be confirmed until the fuse is cut off, and the fuse cut-off step is useless. Once the fuse is cut off, the fuse cannot be returned to an original state.

If these problems can be confirmed before cutting off the fuse, the fuse cut-off step is not performed with respect to the chip whose defect cannot-be remedied, and this is effective for reduction of the manufacturing cost.

Moreover, especially since an environment for the fuse cut-off step is not sufficiently prepared in a trial stage before mass production, there is a large possibility that a cut-off defect of the fuse is caused by the influences by broken pieces, dust and the like at a fuse cut-off time. Therefore, if the operation of the redundancy fuse circuit can be confirmed without cutting off any fuse in the trial stage, this is convenient.

BRIEF SUMMARY OF THE INVENTION

According to an aspect of the present invention, there is provided a redundancy fuse circuit including a function of replacing a defective cell in a memory cell array with a redundancy cell, comprising: a fuse circuit in which an address of the defective cell or a block including the defective cell is programmed as a defective address by presence/absence of cut-off of a fuse; a data latch circuit which latches a signal supplied from a tester to program the defective address in a dummy manner; and a comparator which replaces the defective cell with the redundancy cell based on an address signal supplied from the tester and an output signal of the data latch circuit at an operation confirmation time of the redundancy fuse circuit.

DETAILED DESCRIPTION OF THE INVENTION

A redundancy fuse circuit of an aspect of the present invention will be described below in detail with reference to the accompanying drawings.

1. Outline

An example of the present invention relates to a redundancy fuse circuit (redundancy dummy fuse circuit) capable of producing an effect similar to an effect of cut-off of a fuse without physically cutting off any fuse. The redundancy fuse circuit according to the example of the present invention is capable of reducing the effect similar to that of the cut-off of the fuse without physically cutting off any fuse. Therefore, a redundancy replacing test can be facilitated, a useless fuse cut-off step is removed, and a wrong defective address can be-prevented from being programmed.

The redundancy fuse circuit according to the example of the present invention is disposed in a semiconductor integrated circuit including a memory, and has a function of replacing a defective cell in a memory cell array with a redundancy cell. Here, the semiconductor integrated circuit including the memory includes, for example, a memory embedded microcomputer and the like in addition to a general-purpose memory.

Furthermore, the example of the present invention can be applied to an integrated circuit system including the general-purpose memory and the memory embedded microcomputer. In the example of the present invention, the effect similar to that of the fuse cut-off can be imparted to a chip before actually cutting off the fuse. Therefore, the present invention can be applied to a test method for checking whether or not the chip can be remedied by redundancy replacement, or whether or not the wrong defective address is to be programmed.

2. First Embodiment

First, a redundancy fuse circuit according to a first embodiment of the present invention will be described.

(1) Whole Constitution

Figure 1:
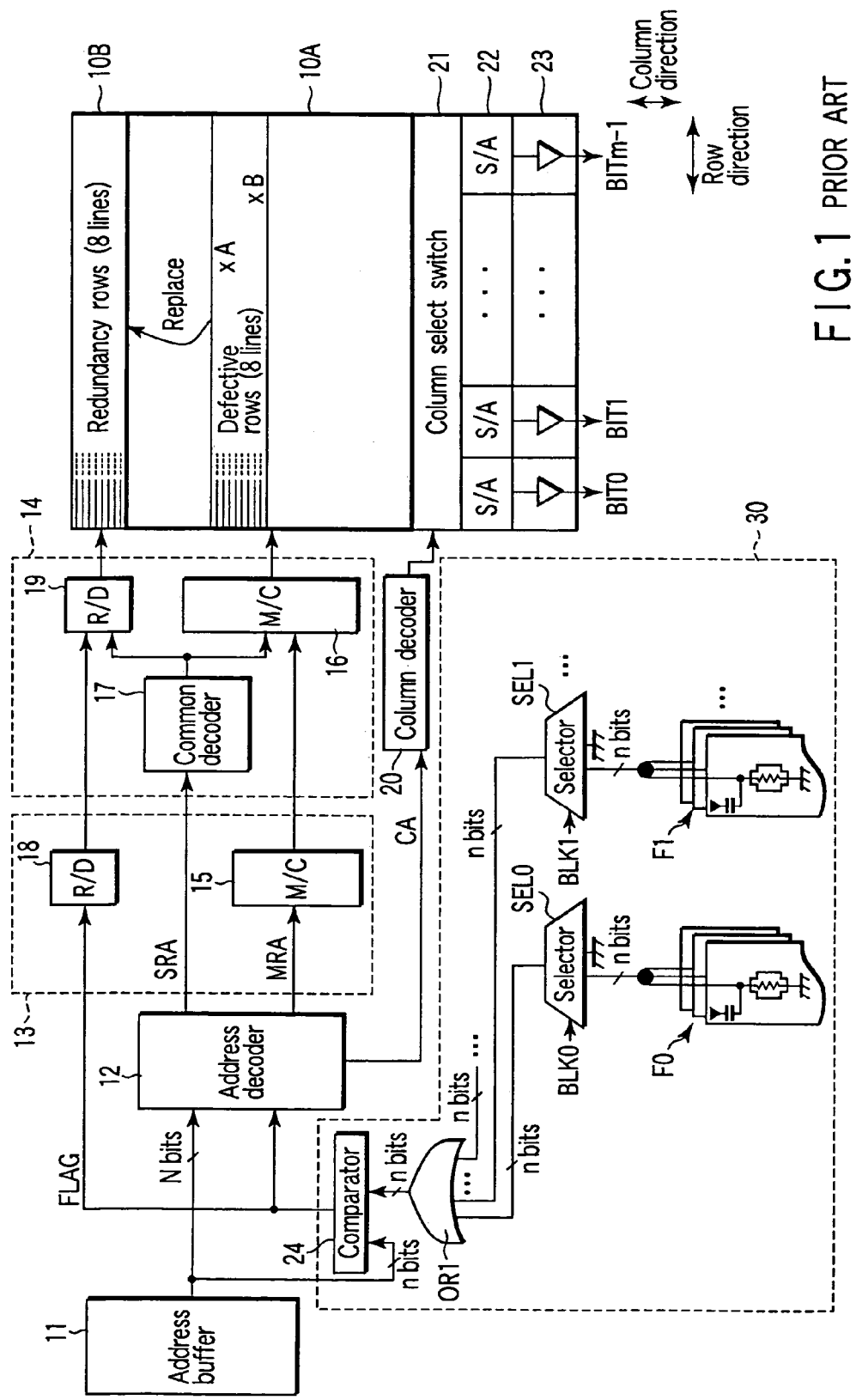
FIG. 1 is a circuit diagram showing a conventional redundancy fuse circuit.
Figure 2:
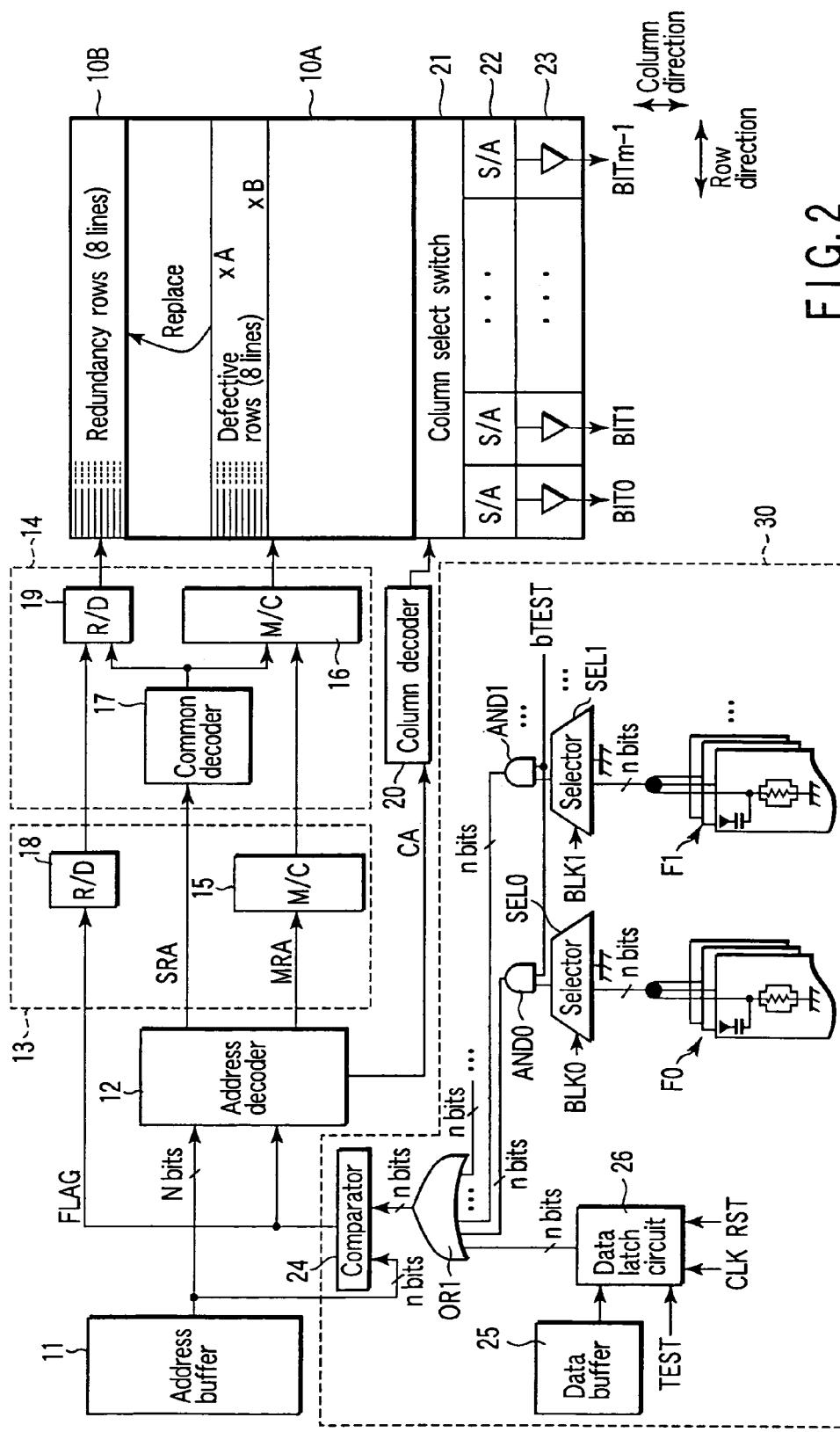
FIG. 2 is a circuit diagram showing a redundancy fuse circuit according to a first embodiment of the present invention.

FIG. 2 shows a memory circuit including the redundancy fuse circuit according to the first embodiment of the present invention.

A memory cell array 10A comprises a plurality of memory cells arranged in an array. Any type of memory cell may be used, such as RAM and ROM. A redundancy cell array 10B is disposed adjacent to the memory cell array 10A. The redundancy cell array 10B comprises a plurality of redundancy cells arranged in the array. The redundancy cell replaces a defective cell in a case where the defective cell exists in the memory cell array 10A.

A plurality of, for example, 512 word lines are arranged in the memory cell array 10A. These word lines are blocked, for example, every eight lines, and the defective cells are replaced with the redundancy cells by a block unit.

For example, as a result of a test of the memory cell array 10A, if the defective cells are present in positions (A) and (B) in the memory cell array 10A, the defective cells are replaced with the redundancy cells by a unit of eight rows (eight word lines) in the block including the defective cells.

An address signal is input into an address decoder 12 via an address buffer 11. The address decoder 12 decodes the address signal to output a main row address signal MRA, a sub-row address signal SRA, and a column address signal CA.

The main row address signal MRA is input into a main body cell decoder 16 of a sub-row decoder 14 via a main body cell (M/C) decoder 15 of a main row decoder 13. The sub-row address signal SRA is input into the main body cell decoder 16 and a redundancy (R/D) decoder 19 of the sub-row decoder 14 via a common decoder 17 in the sub-row decoder 14. The column address signal CA is input into a column decoder 20.

For example, read data is output as output data BIT0, BIT1, ..., BITm-1 to the outside of the chip via a column select switch 21, sense amplifies (S/A) 22, and buffers 23.

Next, a redundancy fuse circuit 30 which is a characteristic part of the present invention will be described.

Defective addresses are programmed in fuse circuits F0, F1, .... Concretely, the address (n bits in the present example) of the block including the defective cells is programmed in the fuse circuits F0, F1, .... For example, the number of fuse circuits F0, F1, ... is equal to that of blocks constituting a redundancy array in a memory cell array 10.

The fuse circuits F0, F1, ... may be of a type in which the defective address is stored by presence/absence of cut-off of a fuse by laser, or an electric (E) fuse capable of electrically cutting off the fuse may also be used. The fuse circuits F0, F1, ... are connected to an OR circuit OR1 via selectors SEL0, SEL1, ... and AND circuits AND0, AND1, ....

The redundancy fuse circuit 30 of the present example has a cell replacement function of actually cutting off the fuse to replace the defective cell with the redundancy cell, and a dummy replacement function of producing an effect similar to that of the cut-off of the fuse without actually cutting off any fuse. Either of these two functions to be used is determined by a test signal TEST.

Cell Replacement Function

The test signal TEST turns to "L", when a usual cell replacement function is used. When the test signal TEST indicates "L" (bTEST indicates "H"), a data latch circuit 26 is inactivated. At this time, all output data (n bits) of the data latch circuit 26 are "0".

On the other hand, a reverse signal bTEST of the test signal TEST input in the AND circuits AND0, AND1, ... indicates "H" (corresponding to "1"). When the defective cell is present in the memory cell array 10A, the selectors SEL0, SEL1, ... select one fuse circuit Fi based on fuse block select signals BLK0, BLK1, .... A selector SELi for the selected fuse circuit Fi outputs the defective address programmed in the fuse circuit Fi. The selectors for all the non-selected remaining fuse circuits set all output data (n bits) to "0".

Therefore, the defective address programmed in the selected fuse circuit Fi is input into a comparator 24 via the selector SELi, AND circuit ANDi, and OR circuit OR1. For example, when the fuse block select signal BLK0 is "H", and the other fuse block select signals BLK1, . . . are "L", the defective address of n bits programmed in a fuse circuit F0 is input into the comparator 24 via the selector SEL0, AND circuit AND0, and OR circuit OR1.

The comparator 24 compares external address data (n bits) with defective address data (n bits) output from the OR circuit OR1. When both the data disagree, for example, a flag FLAG is set to "L". At this time, the address decoder 12 is activated to execute a usual decode operation.

Moreover, when the data agree with each other, for example, the comparator 24 sets the flag FLAG to "H". At this time, the address decoder 12 is inactivated, and redundancy decoders 18, 19 of the main/sub-row decoders 13, 14 are activated. Therefore, one row in redundancy rows (eight rows) is selected instead of one row in defective rows (eight rows).

Dummy Replacement Function

When a dummy replacement function of producing the effect similar to that produced at a time when the fuse is cut off without actually cutting off any fuse is used, the test signal TEST turns to "H". When the test signal-TEST indicates "H" (bTEST indicates "L"), the data latch circuit 26 is activated. At this time, the data latch circuit 26 latches the external address signal (n bits) input from the outside of the chip via a data buffer 25. The external address signal indicates, for example, the address of the block including the defective cell (defective address).

On the other hand, since the reverse signal bTEST of the test signal TEST input in the AND circuits AND0, AND1, . . . indicates "L" (corresponding to "0"), the output data of all the AND circuits AND0, AND1, . . . turn to "0".

Therefore, the external address signal (defective address) latched by the data latch circuit 26 is input into the comparator 24 via the OR circuit OR1. In this manner, the tester outside the chip supplies the defective address signal to the redundancy fuse circuit without physically cutting off any fuse, for example, at a test time, and accordingly the defective cell can be replaced with the redundancy cell in the same manner as in the cut-off of the fuse.

That is, the comparator 24 compares the external address data (n bits) with the defective address data (n bits) output from the OR circuit OR1. When both the data disagree, for example, the flag FLAG is set to "L". At this time, the address decoder 12 is activated to execute the usual decode operation.

Moreover, when the data agree with each other, for example, the comparator 24 sets the flag FLAG to "H". At this time, the address decoder 12 is inactivated, and the redundancy decoders 18, 19 of the main/sub-row decoders 13, 14 are activated. Therefore, one row in the redundancy rows (eight rows) is selected instead of one row in the defective rows (eight rows).

(2) Operation

Next, an operation of the redundancy fuse circuit according to the first embodiment of the present invention will be described.

In the present embodiment, as shown in FIG. 2, the defective cell is replaced with the redundancy cell by the unit of eight rows (eight word lines). As a result of the test of the memory cell array 10A, it is assumed that the defective cells are present in the positions A and B.

First, the operation enters a test mode to verify whether or not the chip can be remedied by the replacement of the defective cell with the redundancy cell.

Since the test signal TEST indicates "H" (bTEST indicates "L"), the data latch circuit 26 is activated, and all the output data of the AND circuits AND0, AND1, . . . turn to "0".

After resetting the data latch circuit 26 by a reset signal RST, the external address signal (defective address) generated by the tester is latched by the data latch circuit 26 in synchronization with a clock signal CLK via the data buffer 25.

The comparator 24 compares the external address data (n bits) with latch data (n bits) output from the OR circuit OR1. When both the data disagree, for example, the flag FLAG is set to "L". At this time, the address decoder 12 is activated to execute the usual decode operation.

Moreover, when the data agree with each other, for example, the comparator 24 sets the flag FLAG to "H". At this time, the address decoder 12 is inactivated, and the redundancy decoders 18, 19 of the main/sub-row decoders 13, 14 are activated. Accordingly, the defective rows (eight rows) are replaced with the redundancy rows (eight rows). Moreover, one row is selected from the redundancy rows (eight rows) by a row address signal.

Figure 4:
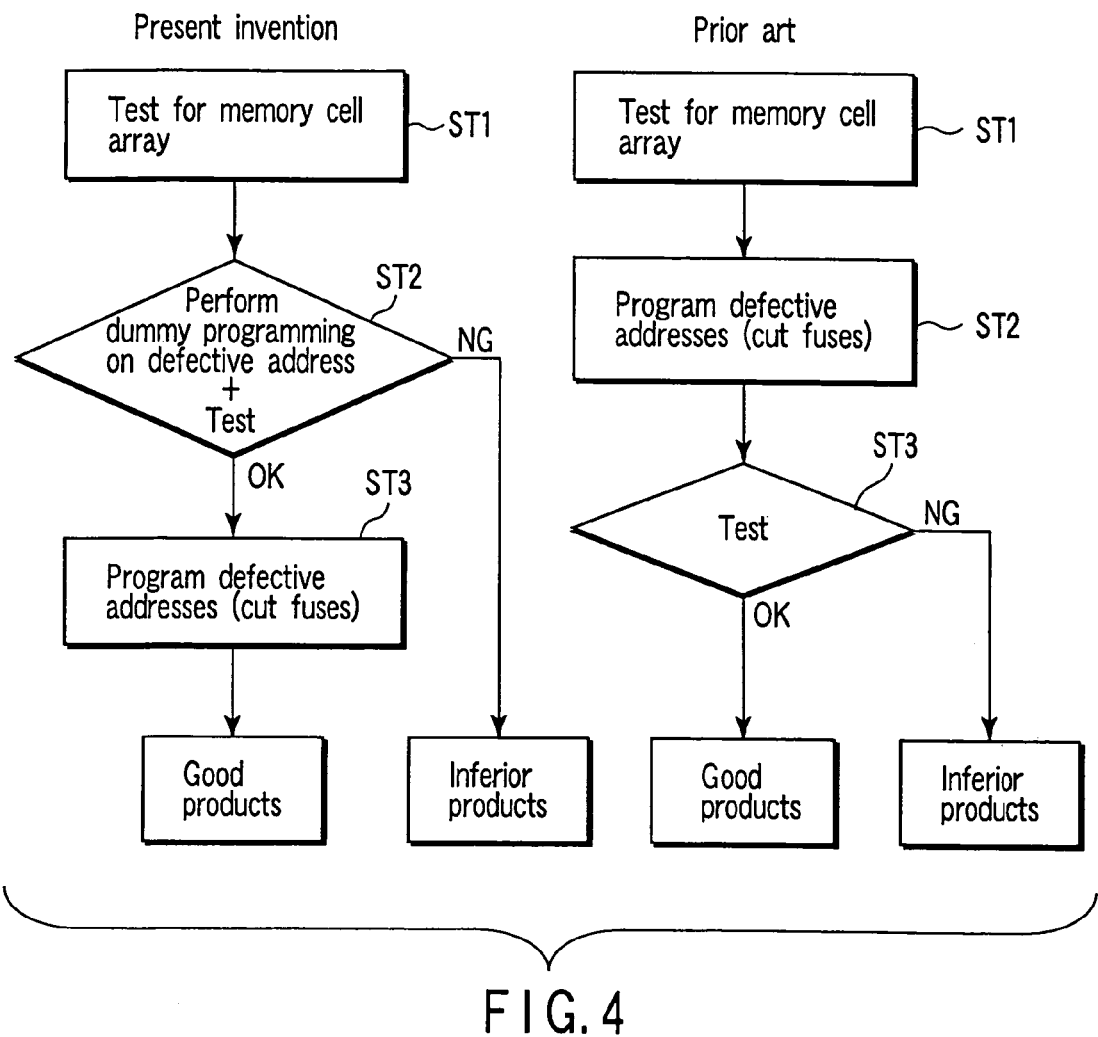
FIG. 4 is a diagram showing a replacing test of the present invention in comparison with a conventional test.

Here, in the test mode in which the operation of the redundancy fuse circuit is checked, as shown in FIG. 4, the data is actually written and read to verify whether or not the write data agrees with the read data (corresponding to "dummy programming of defective address+test" of FIG. 4).

When the data agree with each other, it is meant that the chip can be remedied by the replacement of the defective cell with the redundancy cell, and thereafter the fuse is actually cut off. On the other hand, when both the data disagree, it is meant that the chip cannot be remedied even by the replacement of the defective cell with the redundancy cell, and therefore the chips are treated as inferior goods.

(3) Effect

In this manner, according to the first embodiment of the present invention, with respect to the memory circuit including the redundancy rows, the effect similar to that produced at a time when the fuse is cut off can be produced without physically cutting off the fuse. That is, since the operation of the redundancy fuse circuit can be checked without cutting off any fuse, the redundancy replacing test is facilitated, the useless fuse cut-off step is removed, and the wrong defective address can be prevented from being programmed.

3. Second Embodiment

First, the redundancy fuse circuit according to a second embodiment of the present invention will be described.

(1) Whole Constitution

Figure 3:
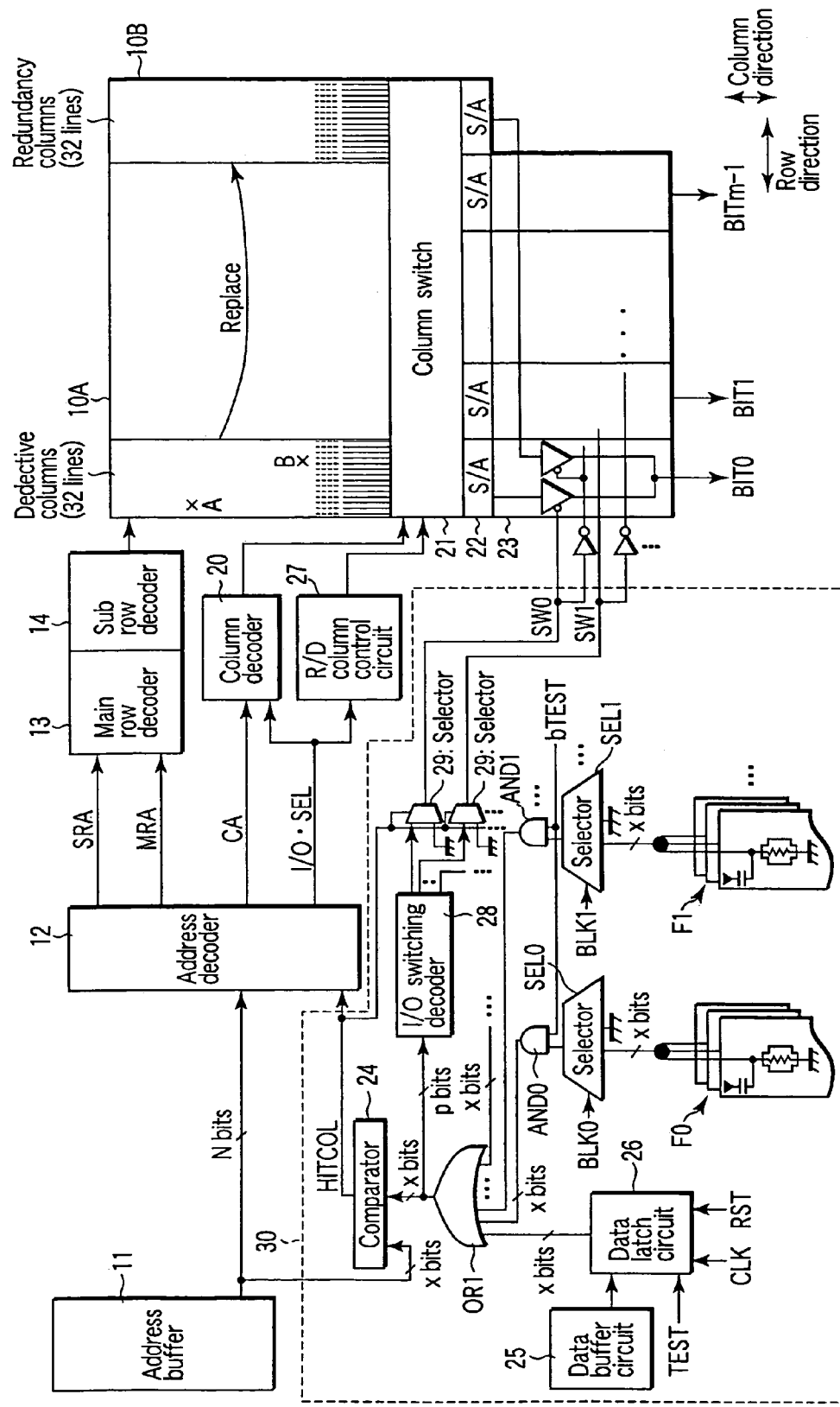
FIG. 3 is a circuit diagram showing the redundancy fuse circuit according to a second embodiment of the present invention.

FIG. 3 shows a memory circuit including the redundancy fuse circuit according to the second embodiment of the present invention.

In the above-described first embodiment, the redundancy fuse circuit according to the example of the present invention is applied to the memory circuit including the redundancy rows. On the other hand, in the second embodiment, the redundancy fuse circuit according to the example of the present invention is applied to a memory circuit including redundancy columns.

The memory cell array 10A comprises a plurality of memory cells arranged in the array. Any type of memory cell may be used, such as RAM and ROM. The redundancy cell array 10B is disposed adjacent to the memory cell array 10A. The redundancy cell array 10B comprises a plurality of redundancy cells arranged in the array. The redundancy cell replaces the defective cell in a case where the defective cell exists in the memory cell array 10A.

A plurality of bit lines are arranged in the memory cell array 10A. These bit lines are blocked, for example, every 32 lines, and the defective cells are replaced with the redundancy cells by the block unit, or by a unit, for example, 4, 8 or 16 bit lines, smaller than the block unit, using the fuse data.

For example, as the result of the test of the memory cell array 10A, if the defective cells are present in the positions (A) and (B) in the memory cell array 10A, the defective cells are replaced with the redundancy cells by a unit of 32 columns (32 bit lines) in the block including the defective cells.

The address signal is input into the address decoder 12 via the address buffer 11. The address decoder 12 decodes the address signal to output the main row address signal MRA, sub-row address signal SRA, column address signal CA, and I/O switch signal I/O•SEL.

The main row address signal MRA and sub-row address signal SRA are input into the main row decoder 13 or the sub-row decoder 14. Since the main row decoder 13 and sub-row decoder 14 have the same constitutions as those of the first embodiment (FIG. 2), the description thereof is omitted. The column address signal CA is input into the column decoder 20. The I/O switch signal I/O•SEL is input into the column decoder 20 and a redundancy (R/D) column control circuit 27.

For example, when the defective cell is replaced with the redundancy cell, a hit signal HITCOL turns to "H", and the I/O switch signal I/O•SEL turns to "H" in the block corresponding to the defective address. At this time, the column decoder 20 is inactivated, and the redundancy (R/D) column control circuit 27 is activated in the block corresponding to the defective address. The redundancy (R/D) column control circuit 27 controls the column select switch 21 so as to output the data from the redundancy cell array 10B. It is to be noted that the defective column may also be replaced with the redundancy column in the I/O buffer 23 without inactivating the column decoder 20.

The column decoder 20 is activated, and the redundancy (R/D) column control circuit 27 is inactivated in blocks other than the block corresponding to the defective address. The column decoder 20 and redundancy (R/D) column control circuit 27 select one from 32 columns (32 bit lines), and turns on the column select switch of one selected column. It is to be noted that not the redundancy column but a usual column may also be selected in the I/O buffer 23 without inactivating the redundancy (R/D) column control circuit 27.

The read data is output as the output data BIT0, BIT1, . . . , BITm to the outside of the chip via the column select switch 21, sense amplifies (S/A) 22, and buffers 23.

Next, the redundancy fuse circuit 30 which is the characteristic part of the present invention will be described.

The defective addresses are programmed in the fuse circuits F0, F1, . . . . Concretely, the address of the defective cell (x bits in the present example) is programmed in the fuse circuits F0, F1, . . . . For example, the number of fuse circuits F0, F1, . . . is equal to that of blocks constituting the redundancy array in the memory cell array 10.

The fuse circuits F0, F1, . . . may be of the type in which the defective address is stored by the presence/absence of cut-off of the fuse by laser, or the electric (E) fuse capable of electrically cutting off the fuse may also be used. The fuse circuits F0, F1, . . . are connected to the OR circuit OR1 via the selectors SEL0, SEL1, . . . and AND circuits AND0, AND1, . . . .

The redundancy fuse circuit 30 of the present example has the cell replacement function of actually cutting off the fuse to replace the defective cell with the redundancy cell, and the dummy replacement function of producing an effect similar to that of the cut-off of the fuse without actually cutting off any fuse. Either of these two functions to be used is determined by the test signal TEST.

Cell Replacement Function

The test signal TEST turns to "L", when the usual cell replacement function is used. When the test signal TEST indicates "L" (bTEST indicates "H"), the data latch circuit 26 is inactivated. At this time, all the output data (x bits) of the data latch circuit 26 are "0".

On the other hand, the reverse signal bTEST of the test signal TEST input in the AND circuits AND0, AND1, . . . indicates "H" (corresponding to "1"). When the defective cell is present in the memory cell array 10A, the selectors SEL0, SEL1, . . . select one fuse-circuit Fi based on the fuse block select signals BLK0, BLK1, . . . . The selector SELi for the selected fuse circuit Fi outputs the defective address programmed in the fuse circuit Fi. The selectors for all the non-selected remaining fuse circuits set all the output data (x bits) to "0".

Therefore, the defective address programmed in the selected fuse circuit Fi is input into the comparator 24 via the selector SELi, AND circuit ANDi, and OR circuit OR1. For example, when the fuse block select signal BLK0 is "H", and the other fuse block select signals BLK1, . . . are "L", the defective address of x bits programmed in the fuse circuit F0 is input into the comparator 24 via the selector SEL0, AND circuit AND0, and OR circuit OR1.

The comparator 24 compares the external address data (x bits) with the defective address data (x bits) output from the OR circuit OR1. When both the data disagree, for example, the hit signal HITCOL is set to "L".

At this time, the address decoder 12 sets the I/O switch signal I/O•SEL to "L". Therefore, the column decoder 20 is activated, and the redundancy (R/D) column control circuit 27 is inactivated to execute the usual decode operation.

Moreover, when the hit signal HITCOL indicates "L", output signals SW0, SW1, . . . of a selector 29 are all set to "L". Therefore, the buffer 23 selects the data read from the memory cell array 10A to output read data BIT0, BIT1, . . . , BITm-1.

On the other hand, when the data agree with each other, for example, the comparator 24 sets the hit signal HITCOL to "H".

At this time, the address decoder 12 sets the I/O switch signal I/O•SEL to "H". Therefore, the column decoder 20 is inactivated, and the redundancy (R/D) column control circuit 27 is activated. The redundancy (R/D) column control circuit 27 controls the column select switch 21 so as to output the data from the redundancy cell array 10B with respect to a block i corresponding to the defective address signal (x bits).

Moreover, when the hit signal HITCOL indicates "H", the selector 29 selects an output signal of an I/O switch decoder 28. The I/O switch decoder 28 decodes the defective address signal (p bits) output from the OR circuit OR1, and sets a switch signal SWi to "H" only with respect to the block i specified by the defective address signal.

For example, when a column 0 (block 0) is specified by the defective address signal (p bits), a switch signal SW0 turns to "H", and the other switch signals SW1, . . . are all "L". Therefore, with respect to the column 0, the buffer 23 selects the data read from the redundancy cell array 10B to output this as the read data BIT0. With respect to the columns other than the column 0, the buffer 23 selects the data read from the memory cell array 10A to output this as the read data BIT1, . . . , BITm-1.

Dummy Replacement Function

When the dummy replacement function of producing the effect similar to that produced at the time when the fuse is cut off without actually cutting off any fuse is used, the test signal TEST turns to "H". When the test signal TEST indicates "H" (bTEST indicates "L"), the data latch circuit 26 is activated. At this time, the data latch circuit 26 latches the external address signal (x bits) input from the outside of the chip via the data buffer 25. The external address signal indicates, for example, the address of the defective cell (defective address).

On the other hand, since the reverse signal bTEST of the test signal TEST input in the AND circuits AND0, AND1, . . . indicates "L" (corresponding to "0"), the output data of all the AND circuits AND0, AND1, . . . turn to "0".

Therefore, the external address signal (defective address) latched by the data latch circuit 26 is input into the comparator 24 via the OR circuit OR1. In this manner, the tester outside the chip supplies the defective address signal to the redundancy fuse circuit without-physically cutting off any fuse, for example, at the test time, and accordingly the defective cell can be replaced with the redundancy cell in the same manner as in the cut-off of the fuse.

That is, the comparator 24 compares the external address data (x bits) with the defective address data (x bits) output from the OR circuit OR1. When both the data disagree, for example, the hit signal HITCOL is set to "L".

At this time, the address decoder 12 sets the I/O switch signal I/O•SEL to "L". Therefore, the column decoder 20 is activated, the redundancy (R/D) column control circuit 27 is inactivated, and the usual decode operation is executed.

Moreover, when the hit signal HITCOL indicates "L", all the output signals SW0, SW1, . . . of the selector 29 turn to "L". Therefore, the buffer 23 selects the data read from the memory cell array 10A to output this as the read data BIT0, BIT1, . . . , BITm-1.

On the other hand, when the data agree with each other, for example, the comparator 24 sets the hit signal HITCOL to "H".

At this time, the address decoder 12 sets the I/O switch signal I/O•SEL to "H". Therefore, the column decoder 20 is inactivated, and the redundancy (R/D) column control circuit 27 is activated. The redundancy (R/D) column control circuit 27 controls the column select switch 21 so as to output the data from the redundancy cell array 10B with respect to the block i corresponding to the defective address signal (x bits).

Moreover, when the hit signal HITCOL indicates "H", the selector 29 selects the output signal of the I/O switch decoder 28. The I/O switch decoder 28 decodes the defective address signal (p bits) output from the OR circuit OR1, and sets the switch signal SWi to "H" only with respect to the block i specified by the defective address signal.

For example, when the column 0 (block 0) is specified by the defective address signal (p bits), the switch signal SW0 turns to "H", and the other switch signals SW1, . . . are all "L". Therefore, with respect to the column 0, the buffer 23 selects the data read from the redundancy cell array 10B to output this as the read data BIT0. With respect to the columns other than the column 0, the buffer 23 selects the data read from the memory cell array 10A to output this as the read data BIT1, . . . , BITm-1.

(2) Operation

Next, the operation of the redundancy fuse circuit according to the second embodiment of the present invention will be described.

In the present embodiment, as shown in FIG. 3, the defective cell is replaced with the redundancy cell by the block unit, that is, a unit of 32 columns (32 bit lines). As the result of the test of the memory cell array 10A, it is assumed that the defective cells are present in the positions A and B.

First, the operation enters the test mode to verify whether or not the chip can be remedied by the replacement of the defective cell with the redundancy cell.

Since the test signal TEST indicates "H" (bTEST indicates "L"), the data latch circuit 26 is activated, and all the output data of the AND circuits AND0, AND1, . . . turn to "0".

After resetting the data latch circuit 26 by the reset signal RST, the external address signal (defective address) generated by the tester is latched by the data latch circuit 26 in synchronization with the clock signal CLK via the data buffer 25.

The comparator 24 compares the external address data (x bits) with the latch data (x bits) output from the OR circuit OR1. When both the data disagree, for example, the hit signal HITCOL is set to "L". At this time, the column decoder 20 is activated to execute the usual decode operation.

Moreover, when the data agree with each other, for example, the comparator 24 sets the hit signal HITCOL to "H". At this time, in the block corresponding to the defective address signal, the column decoder 20 is inactivated, and the redundancy (R/D) column control circuit 27 is activated. Accordingly, the defective columns (32 columns) in the block corresponding to the defective address signal are replaced with the redundancy columns (32 columns). Moreover, one column is selected from the redundancy columns (32 columns) by the column address signal.

Here, in the test mode in which the operation of the redundancy fuse circuit is checked, as shown in FIG. 4, the data is actually written and read to verify whether or not the write data agrees with the read data (corresponding to "dummy programming of defective address+test" of FIG. 4).

When the data agree with each other, it is meant that the chip can be remedied by the replacement of the defective cell with the redundancy cell, and thereafter the fuse is actually cut off. On the other hand, when both the data disagree, it is meant that the chip cannot be remedied even by the replacement of the defective cell with the redundancy cell, and therefore the chips are treated as the inferior goods.

(3) Effect

In this manner, according to the second embodiment of the present invention, with respect to the memory circuit including the redundancy columns, the effect similar to that produced at the time when the fuse is cut off can be produced without physically cutting off the fuse. That is, since the operation of the redundancy fuse circuit can be checked without cutting off any fuse, the redundancy replacing test is facilitated, the useless fuse cut-off step is removed, and the wrong defective address can be prevented from being programmed.

4. Test Method

FIG. 4 shows comparison of the present invention with a prior art with respect to the redundancy replacing test.

In the prior art, a memory cell array main body has heretofore been tested, the defective cell is confirmed, then the defective address is programmed (fuse cut-off) (steps ST1 and ST2). Thereafter, the operation of the redundancy fuse circuit is checked (tested). When the circuit normally operates, the circuit is treated as pass. When the circuit does not normally operate, the circuit is treated as the inferior good (step ST3). In this case, it cannot be finally judged whether or not the product is the pass or inferior good until the fuse is cut off.

On the other hand, in the example of the present invention, the memory cell array main body is tested. When the defective cell is confirmed, dummy programming of the defective address and the operation check (test) of the redundancy fuse circuit are executed (steps ST1 and ST2). Moreover, when the redundancy fuse circuit normally operates, the circuit is treated as the pass. When the circuit does not normally operate, the circuit is treated as the inferior good. That is, only with respect to the product judged to be normal, the programming of the defective address, that is, the cut-off of the fuse may be performed (step ST3).

5. Others

The example of the present invention is applied to the redundancy fuse circuit, but is not limited to this, and can be broadly applied to a circuit including a fuse device. That is, the example of the present invention is effective in a case where the operation of the circuit including the fuse device is checked without cutting off any fuse device.

As defective address, according to the example of the present invention, the cells are replaced in a dummy electric mode without actually cutting off any fuse in the redundancy fuse circuit. Therefore, it can be checked whether or not the defective cell can be remedied by the test operation before cutting off the fuse. As a result, for example, even in situations in which an environment for cutting off the fuse is not prepared, such as a trial stage before mass production, the redundancy replacing test is easily performed, and yield enhancement or the like can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A redundancy fuse circuit comprising:
   a fuse circuit which stores a first address of a defective cell or a block including the defective cell;
   a data latch circuit which latches a second address supplied from a tester in a test mode;
   a comparator which compares a third address supplied from the tester with one of the first and second addresses, and replaces the defective cell with a redundancy cell when the third address is coincident with one of the first and second addresses; and
   a logic circuit which supplies the first address to the comparator in a normal operation mode and supplies the second address to the comparator in the test mode.

2. The redundancy fuse circuit according to claim 1, wherein each of the first and second addresses is one of a row address and a column address.

3. The redundancy fuse circuit according to claim 1, wherein the first address is the same as the second address.

4. The redundancy fuse circuit according to claim 1, wherein the logic circuit supplies one of the first and second addresses to the comparator based on a test signal.

5. The redundancy fuse circuit according to claim 1, wherein the fuse circuit has a fuse device that is cut by a laser.

6. The redundancy fuse circuit according to claim 1, wherein the fuse circuit has an electrical fuse device.

7. The redundancy fuse circuit according to claim 1, wherein the redundancy fuse circuit is included in a semiconductor memory.

8. The redundancy fuse circuit according to claim 1, wherein the redundancy fuse circuit is included in a semiconductor memory which is included in an integrated system.

9. The redundancy fuse circuit according to claim 1, wherein the redundancy fuse circuit is included in a memory embedded microcomputer.

10. The redundancy fuse circuit according to claim 1, wherein the redundancy fuse circuit is included in a memory embedded microcomputer which is included in an integrated system.

11. The redundancy fuse circuit according to claim 1, wherein the redundancy fuse circuit is included in a semiconductor integrated circuit.

12. The redundancy fuse circuit according to claim 1, wherein the redundancy fuse circuit is included in a semiconductor integrated circuit which is included in an integrated system.

13. A method of testing a redundancy fuse circuit, comprising:
   latching a defective address to a data latch circuit;
   comparing an input address from a tester with the defective address;
   replacing a defective cell with a redundancy cell when the input address is coincident with the defective address;
   executing a test on the redundancy cell; and
   programming the defective address to a fuse circuit after the test, wherein the defective address is programmed to a fuse device that is cut by a laser.

14. The method according to claim 13, wherein the defective address is programmed when the redundancy cell is not defective.

15. The method according to claim 13, wherein the defective address is not programmed when the redundancy cell is defective.

16. The method according to claim 13, wherein the defective address is a row address.

17. The method according to claim 13, wherein the defective address is a column address.

18. The method according to claim 13, wherein the input address is a test address.

* * * * *